Dec. 9, 1969 ISAMU WASHIZUKA ET AL 3,483,400

FLIP-FLOP CIRCUIT

Filed June 8, 1967

INVENTORS
ISAMU WASHIZUKA
HITOSHI HANAHARA
BY
ATTORNEY

United States Patent Office 3,483,400
Patented Dec. 9, 1969

3,483,400
FLIP-FLOP CIRCUIT

Isamu Washizuka, Osaka-shi, and Hitoshi Hanabara, Yamatokoriyama-shi, Japan, assignors to Hayakawa Denki Kogyo Kabushiki Kaisha, Osaka-fu, Japan, a company of Japan Filed June 8, 1967, Ser. No. 644,728
Claims priority, application Japan, June 15, 1966, 41/39,098
Int. Cl. H03k 3/26
U.S. Cl. 307—279 8 Claims

ABSTRACT OF THE DISCLOSURE

A flip-flop circuit utilizing amplifying devices capable of storing information and having switching means connected at least two stages in cascade and forming a feedback circuit from the output of the secod stage to the input of the first stage wherein said switching means are actuated in sequence.

This invention relates to a flip-flop circuit and more specifically to a novel and improved flip-flop circuit utilizing electronic amplifying devices capable of storing information.

Considerable effort has been devoted to the study of semi-conductor circuits to perform certain integrating functions particularly in the field of electronic computation. While the flip-flop circuit has been found useful as the memory unit of an electronic computer, known circuits have not been found to be satisfactory. For example, in utilizing a flip-flop circuit with amplifying elements having storage time, the elements were connected in cascade and a feedback path was provided between the element forming the second stage and the input of the element forming the first stage. Concurrently operated switches controlled by a single synchronizing signal were inserted in the connection between the output of the first stage and the input of the second stage and in the feedback path. In the operation of such a device, the condition of the second stage, whether conducting or nonconducting, necessarily influenced the input of the first stage upon closure of the switch in the feedback circuit. Thus upon introduction of input information the first stage and closure of the switching elements, the circuit could become unstable and prevent the correct storage of information. In the case wherein the elements were of the P-channel type and when a negative potential had been stored in the second stage, the output terminal of the second stage would be at zero potential. Under these conditions if a negative input signal was then applied and stored in the first stage, it became conductive and its output terminal would therefore be at zero potential. Closure of the switches caused the information stored in the first stage to be transferred to the second stage, but the zero potential condition which existed in the second stage would tend to cancel the negative input signal applied to the first stage with the result that the new information may be erased. It has been suggested that amplifying elements having different mutual conductances or gate capacitances could be utilized, but stable operation would nevertheless be difficult to attain since such differences are in terms of analog quantities. Furthermore, it is difficult to maunfacture amplifying elements having such different characteristics.

The novel and improved flip-flop circuit in accordance with the invention overcomes the difficulties heretofore encountered and provides a novel and improved circuit which is characterized by its simplicity, stability, and ease of control. This is attained through the utilization of a circuit wherein the input signal containing desired information is first applied to the first stage. Thereafter the switch coupling the first stage to the second stage is closed to store the information in the second stage and then upon the elapse of a predetermined time the feedback circuit is closed. With this arrangement it is not necessary to utilize elements having different characteristics and at the same time stable dependable operation is obtained.

The above and other objects and advantages of the invention will become more apparent from the following description and drawings forming part of the application.

Figure 1:
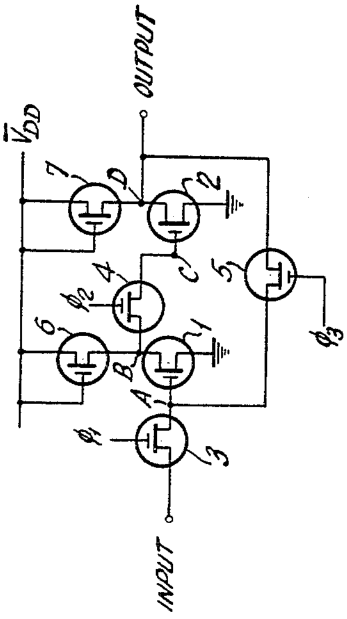
FIGURE 1 is a circuit diagram of one embodiment of a flip-flop circuit in accordance with the invention.

Referring now to FIGURE 1, the basic elements of the circuit comprise MOS field effect transistors of the P-channel type and are denoted by the numerals 1 and 2. These transistors 1 and 2 perform the flip-flop function and operate as amplifying elements each having the ability to store information. The input signal is fed to the gate electrode of transistor 1 through a field effect transistor 3 which functions as a gate to permit the transfer of the input signal to the input gate electrode of transistor 1 when a control pulse $\phi_1$ is applied to the gate electrode of transistor 3. The source electrode of transistor 1 in the instant embodiment of the invention is connected to ground while the drain electrode is connected through a field effect transistor 6 which functions as a load resistor. More specifically, the drain electrode of transistor 1 is connected to the source electrode of transistor 6 and the gate and drain electrodes are connected to a voltage source $V_{DD}$.

The output signal appearing at the drain electrode of transistor 1 is fed through a field effect transistor 4, operating as a gate to the gate electrode of transistor 2 and means are provided for the application of a control signal $\phi_2$ to the gate electrode of transistor 4. The source electrode of transistor 2 is connected to ground while the drain electrode forming the output is connected through a field effect transistor 7 to the voltage supply $V_{DD}$ in the same manner as described in connection with the transistor 6. The feedback path from the drain electrode of transistor 2 to the gate electrode of transistor 1 is through a field effect transistor 5 which is controlled by a pulse $\phi_3$ applied to its gate electrode.

Figure 2:
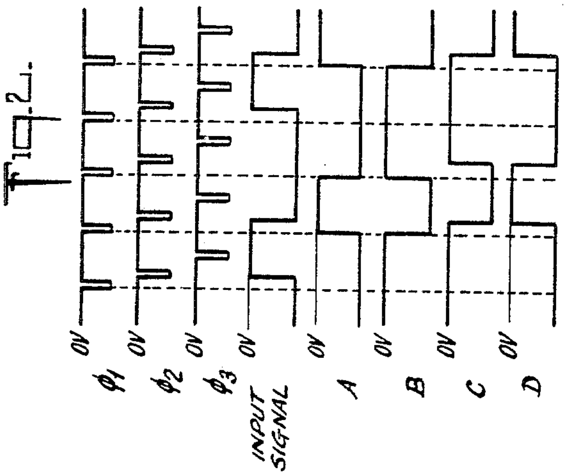
FIGURE 2 illustrates in wave form the potentials occurring at different parts of the circuit at selected given instants of time.

The synchronizing pulses $\phi_1$, $\phi_2$, and $\phi_3$ are applied to the gates 3, 4, and 5 in the manner shown in the upper portion of FIGURE 2. It will be observed from FIGURE 2 that these synchronizing signals are each shifted in a digital mode one from the other so that the three gates are closed in sequence.

With the circuit thus far described, when an input signal is applied to the gate 3, application of the control pulse $\phi_1$ will cause the information to be stored in the input gate of transistor 1. Thereafter the synchronizing pulse $\phi_2$ is applied to gate 4 causing it to conduct and transfer the information to transistor 2. Thereafter the pulse $\phi_3$ is applied to the gate 5. As a result, stable operation of the gates is obtained and the information stored therein is maintained until another input signal is applied.

The operation may be observed more clearly from the lower portion of FIGURE 2 which illustrates the waveforms at the points A through D in the circuit. For instance, upon the application of an input signal to the gate 3, which for purposes of illustration occurs after the occurrence of the first pulse $\phi_1$, the input signal is applied to transistor 1 upon the occurrence of the second pulse $\phi_1$ at which time the point A rises to zero volts and the point B therefore goes negative. Upon the occurrence of the pulse $\phi_2$ a negative signal is stored in the input gate of transistor 2, and at the same time the output of transistor 2 increases to zero voltage. Thus it is evident that during the absence of the synchronizing signal $\phi_1$, the circuit continues to store the information previously received. When the circuit is used in a register of an electronic computer, it serves as a memory unit for one bit and the switch 3 controls information transmission between bits.

It may be desirable to use as amplification elements 1 and 2 electron devices having appreciable storage time in place of the field effect transistors. In such a case the width and phase of the timing pulses would be arranged to correspond suitably to the storage time of such amplification elements.

Figure 3:
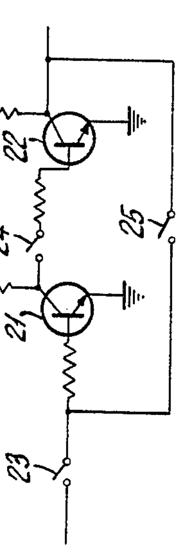
FIGURE 3 is a digrammatic illustration of a modified form of circuit in accordance with the invention.

FIGURE 3 illustrates a circuit utilizing conventional transistors in place of the field effect transistors. The storage time of a conventional transistor such as the junction type can be modified by varying the amount of overdrive applied to the transistor. In this way it is possible to use such junction transistors 1 and 2 of FIGURE 1. In this embodiment of the invention the switches 23, 24, and 25 would be controlled by appropriate synchronizing signals such as the signals $\phi_1$, $\phi_2$, and $\phi_3$, described in connection with FIGURE 1.

Figure 4:
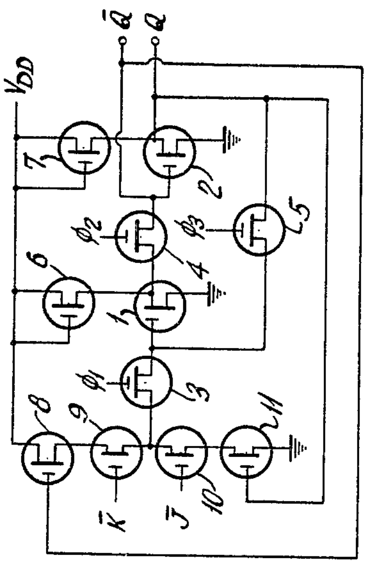
FIGURE 4 is a circuit diagram of still another embodiment of the invention.

FIGURE 4 is a circuit diagram of a modified flip-flop circuit of the JK type. This circuit is substantially identical to the circuit shown in FIGURE 1 and like numerals have been used to denote like elements in each figure. The circuit of FIGURE 4 includes additional input gating elements such as field effect transistors 8, 9, 10, and 11. External inputs $\overline{J}$ and $\overline{K}$ are applied to the gate inputs of transistors 9 and 10 while the two output states $\overline{Q}$ and Q are fed to the input gates of transistors 8 and 11 respectively.

The flip-flop circuit of this invention effects the storage of information by the use of three synchronizing signals having different phases and by effecting closure of the feedback path to the input of the first stage in a digital mode and after the response of the second stage amplifying element. This procedure affords extremely stable operation not attainable with prior known circuits. The instant invention can be used as both a static and dynamic device depending on the presence or absence of the synchronizing signal $\phi_1$. Furthermore, the shifting and storing states can be easily controlled. Thus the circuit of this invention enables the utilization of semi-conductors to perform integrating functions in an electronic computer and constitutes an important and significant advance in the computer field.

While only certain embodiments of the invention have been illustrated and described, it is apparent that alterations, modifications and changes may be made without departing from the true scope and spirit thereof.

What is claimed is:

1. A flip-flop circuit comprising at least one first stage election device and at least one second stage election device, said devices each having a storage function and input and output terminals, first switching means connecting the output of the first stage to the input of the second stage, second switching means connecting the output of the second stage to the input of the first stage means for applying an information signal to the input of the first stage, and means connected to said switching means and operable to actuate said first switching means after the application of said information signal and then actuate said second switching means upon the elapse of a digital time period following actuation of the first switching means.

2. A flip-flop circuit according to claim 1 wherein each of said switching means comprises an election device adapted to close its associated circuit upon the application of a control signal and the last said means comprises two control signals with the phase of one signal shifted in digital mode relative to the other signal.

3. A flip-flop circuit according to claim 1 wherein input switching means is connected to the input of said first stage and said input switching means, first switching means and second switching means are sequentially operated actuated in a digital mode.

4. A flip-flop circuit according to claim 1 wherein at least two election gates are connected to said first stage, said information signal is applied to one of said gates and the output signal from said second stage is applied to the other of said gates.

5. A flip-flop circuit according to claim 1 wherein said devices are junction transistors each having a relatively long storage time.

6. A flip-flop circuit according to claim 3 wherein said devices are MOS field effect transistors having capacitive input gates and wherein information is stored in said gates.

7. A flip-flop circuit according to claim 6 wherein said input, first and second switching means are MOS field effect transistors and said means for operating said switching means are electric signals applied to the gates of the last said transistors.

8. A flip-flop circuit according to claim 6 wherein said transistors have input, drain and source terminals, and the drain electrode of each transistor is connected to a voltage supply through a field effect transistor function as a load impedance.

References Cited

UNITED STATES PATENTS

| | | | |
|---|---|---|---|
| 3,283,170 | 11/1966 | Buie | 307—203 XR |
| 3,292,014 | 12/1966 | Brooksby | 307—238 |
| 3,388,292 | 6/1968 | Burns | 307—205 XR |
| 3,395,292 | 6/1968 | Bogert | 307—304 XR |
| 3,440,444 | 4/1969 | Rapp | 307—251 XR |

DONALD D. FORRER, Primary Examiner

STANLEY T. KRAWCZEWICZ, Assistant Examiner

U.S. Cl. X.R.

307—205, 242, 238, 251, 289, 221